United States Patent
Wojtczak et al.

(10) Patent No.: US 8,293,694 B2
(45) Date of Patent: *Oct. 23, 2012

(54) AQUEOUS CLEANING COMPOSITION CONTAINING COPPER-SPECIFIC CORROSION INHIBITOR FOR CLEANING INORGANIC RESIDUES ON SEMICONDUCTOR SUBSTRATE

(75) Inventors: William A. Wojtczak, Austin, TX (US); Ma. Fatimo Seijo, Hayward, CA (US); David Bernhard, Kooskia, ID (US); Long Nguyen, San Jose, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 147 days.

This patent is subject to a terminal disclaimer.

(21) Appl. No.: 12/581,843

(22) Filed: Oct. 19, 2009

(65) Prior Publication Data

US 2010/0035785 A1 Feb. 11, 2010

Related U.S. Application Data

(63) Continuation of application No. 11/135,892, filed on May 24, 2005, now Pat. No. 7,605,113, and a continuation of application No. 10/047,554, filed on Oct. 23, 2001, now Pat. No. 6,896,826, and a continuation-in-part of application No. 09/818,073, filed on Mar. 27, 2001, now Pat. No. 6,755,989, and a continuation-in-part of application No. 08/924,021, filed on Aug. 29, 1997, now Pat. No. 6,224,785.

(51) Int. Cl.
*C11D 7/50* (2006.01)
*G03F 7/42* (2006.01)

(52) U.S. Cl. .......... 510/175; 134/1.3; 252/79.1
(58) Field of Classification Search .......... 510/175; 134/1.3; 252/79.1
See application file for complete search history.

(56) References Cited

U.S. PATENT DOCUMENTS

| | | | |
|---|---|---|---|
| 4,087,367 | A | 5/1978 | Rioult et al. |
| 4,113,551 | A | 9/1978 | Bassous et al. |
| 4,165,295 | A | 8/1979 | Vander Mey |
| 4,215,005 | A | 7/1980 | Vander Mey |
| 4,349,411 | A | 9/1982 | Okinaka |

(Continued)

FOREIGN PATENT DOCUMENTS

DE 153308 12/1981

(Continued)

OTHER PUBLICATIONS

Chinese State Intellectual Property Office, Second Office Action, Oct. 13, 2010, Chinese Patent Application No. 200810178886.3.

(Continued)

*Primary Examiner* — Gregory Webb
(74) *Attorney, Agent, or Firm* — Tristan A. Fuierer; Moore & Van Allen, PLLC; Rosa Yaghmour

(57) ABSTRACT

A semiconductor wafer cleaning formulation, including 1-35% wt. fluoride source, 20-60% wt. organic amine(s), 0.1-40% wt. nitrogenous component, e.g., a nitrogen-containing carboxylic acid or an imine, 20-50% wt. water, and 0-21% wt. metal chelating agent(s). The formulations are useful to remove residue from wafers following a resist plasma ashing step, such as inorganic residue from semiconductor wafers containing delicate copper interconnecting structures.

19 Claims, 6 Drawing Sheets

U.S. PATENT DOCUMENTS

| | | |
|---|---|---|
| 4,371,443 A | 2/1983 | Keeney |
| 4,569,722 A | 2/1986 | Maury et al. |
| 4,599,175 A | 7/1986 | Yamamizu et al. |
| 4,765,844 A | 8/1988 | Merrem et al. |
| 4,785,137 A | 11/1988 | Samuels |
| 4,795,582 A | 1/1989 | Ohmi et al. |
| 4,863,563 A | 9/1989 | Scardera et al. |
| 4,871,422 A | 10/1989 | Scardera et al. |
| 4,921,572 A | 5/1990 | Roche |
| 4,964,919 A | 10/1990 | Payne |
| 5,051,212 A | 9/1991 | Culshaw et al. |
| 5,091,103 A | 2/1992 | Dean et al. |
| 5,094,701 A | 3/1992 | Norman et al. |
| 5,241,118 A | 8/1993 | Saxton et al. |
| 5,277,835 A | 1/1994 | Ohmi et al. |
| 5,308,745 A | 5/1994 | Schwartzkopf |
| 5,320,709 A | 6/1994 | Bowden et al. |
| 5,334,332 A | 8/1994 | Lee |
| 5,421,906 A | 6/1995 | Borah |
| 5,453,401 A | 9/1995 | Grivna et al. |
| 5,466,389 A | 11/1995 | Ilardi et al. |
| 5,498,293 A | 3/1996 | Ilardi et al. |
| 5,509,970 A | 4/1996 | Shiramizu |
| 5,512,201 A | 4/1996 | Singh et al. |
| 5,560,857 A | 10/1996 | Sakon et al. |
| 5,561,105 A | 10/1996 | Honda |
| 5,571,447 A | 11/1996 | Ward et al. |
| 5,618,645 A | 4/1997 | Nakano et al. |
| 5,645,628 A | 7/1997 | Endo et al. |
| 5,662,769 A | 9/1997 | Schonauer et al. |
| 5,698,503 A | 12/1997 | Ward et al. |
| 5,709,756 A | 1/1998 | Ward et al. |
| 5,780,406 A | 7/1998 | Honda et al. |
| 5,856,062 A | 1/1999 | Hoshi |
| 5,885,362 A | 3/1999 | Morinaga et al. |
| 5,962,385 A | 10/1999 | Maruyama et al. |
| 5,989,353 A | 11/1999 | Skee et al. |
| 6,030,932 A | 2/2000 | Leon et al. |
| 6,080,709 A | 6/2000 | Ishikawa et al. |
| 6,136,714 A | 10/2000 | Schutz |
| 6,224,785 B1 | 5/2001 | Wojtczak et al. |
| 6,235,693 B1 | 5/2001 | Cheng et al. |
| 6,255,266 B1 | 7/2001 | Gupta et al. |
| 6,280,651 B1 | 8/2001 | Wojtczak et al. |
| 6,323,168 B1 | 11/2001 | Kloffenstein et al. |
| 6,344,432 B1 | 2/2002 | Wjotczak et al. |
| 6,387,821 B1 | 5/2002 | Aoki |
| 6,391,794 B1 | 5/2002 | Chen et al. |
| 6,420,329 B1 | 7/2002 | Callaghan et al. |
| 6,440,856 B1 | 8/2002 | Bessho et al. |
| 6,465,403 B1 | 10/2002 | Skee |
| 6,531,071 B1 | 3/2003 | Bedge |
| 6,537,381 B1 | 3/2003 | Mikhaylich et al. |
| 6,566,315 B2 * | 5/2003 | Wojtczak et al. .......... 510/175 |
| 6,660,700 B2 * | 12/2003 | Wojtczak et al. .......... 510/175 |
| 6,896,826 B2 * | 5/2005 | Wojtczak et al. .......... 252/79.1 |
| 6,967,169 B2 * | 11/2005 | Wojtczak et al. .......... 438/710 |
| 7,605,113 B2 * | 10/2009 | Wojtczak et al. .......... 510/175 |
| 7,662,762 B2 * | 2/2010 | Wojtczak et al. .......... 510/175 |
| 7,807,613 B2 | 10/2010 | Rovito et al. |
| 2002/0034874 A1 | 3/2002 | Aoki |
| 2002/0066465 A1 | 6/2002 | Gotoh et al. |

FOREIGN PATENT DOCUMENTS

| | | |
|---|---|---|
| EP | 0317542 B1 | 3/1995 |
| EP | 680078 | 11/1995 |
| EP | 812011 | 12/1997 |
| GB | 2287827 | 9/1995 |
| JP | 07-297158 | 11/1995 |
| JP | 8250461 | 9/1996 |
| JP | 08306651 A | 11/1996 |
| JP | 09-062013 | 3/1997 |
| JP | 2001051429 A | 2/2001 |
| JP | 2001064688 A | 3/2001 |
| JP | 2002050607 A | 2/2002 |
| JP | 2002299300 A | 10/2002 |
| WO | 9800244 | 1/1998 |
| WO | 0066697 | 11/2000 |

OTHER PUBLICATIONS

Noguchi, et al.; "Kinki Aruminyumu Hyomen Shori Kenkyuaki Kaishi," 1996, 179, 3-8.

* cited by examiner

AQUEOUS CLEANING COMPOSITION CONTAINING COPPER-SPECIFIC CORROSION INHIBITOR FOR CLEANING INORGANIC RESIDUES ON SEMICONDUCTOR SUBSTRATE

RELATED APPLICATIONS

This application is a continuation application claiming benefit of U.S. patent application Ser. No. 11/135,892 filed May 24, 2005, which is a continuation application claiming benefit of U.S. patent application Ser. No. 10/047,554 filed Oct. 23, 2001, now U.S. Pat. No. 6,896,826, which claims the benefit of U.S. patent application Ser. No. 09/818,073 filed Mar. 27, 2001, now U.S. Pat. No. 6,755,989, which in turn claims priority of U.S. patent application Ser. No. 08/924,021 filed on Aug. 29, 1997, now U.S. Pat. No. 6,224,785, which in turn claims the priority of U.S. Provisional Patent Application 60/044,824 filed Apr. 25, 1997 and U.S. Provisional Patent Application 60/034,194 filed Jan. 9, 1997, all of which are incorporated by reference herein in their entireties.

FIELD OF THE INVENTION

The present invention relates generally to chemical formulations useful in semiconductor manufacturing and particularly to chemical formulations that are utilized to remove residue from wafers following a resist plasma ashing step. More specifically, the present invention relates to cleaning formulations for removal of inorganic residue from semiconductor wafers containing delicate copper interconnecting structures.

DESCRIPTION OF THE PRIOR ART

The prior art teaches the utilization of various chemical formulations to remove residues and clean wafers following a resist ashing step. Some of these prior art chemical formulations include alkaline compositions containing amines and/or tetraalkyl ammonium hydroxides, water and/or other solvents, and chelating agents. Still other formulations are based on acidic to neutral solutions containing ammonium fluoride.

The various prior art formulations have drawbacks that include unwanted removal of metal or insulator layers and the corrosion of desirable metal layers, particularly copper or copper alloys features. Some prior art formulations employ corrosion inhibiting additives to prevent undesirable copper metal corrosion during the cleaning process. However, conventional corrosion-inhibiting additives typically have detrimental effects on the cleaning process because such additives interact with the residue and inhibit dissolution of such residue into the cleaning fluid. Moreover, conventional additives do not easily rinse off the copper surface after completion of the cleaning process. Such additives therefore remain on the surface sought to be cleaned, and result in contamination of the integrated circuits. Contamination of the integrated circuit can adversely increase the electrical resistance of contaminated areas and cause unpredictable conducting failure within the circuit.

The formulation of post CMP cleaners for advanced integrated circuit manufacturing such as copper and tungsten interconnect materials, includes slurry removal and residue dissolution components that accelerate the physical cleaning process. However, these conventional additives typically have detrimental effects on the metal surface by increasing resistance and corrosion sensitivity.

It is therefore one object of the present invention to provide chemical formulations that effectively remove residue following a resist ashing step, and which do not attack and potentially degrade delicate structures intended to remain on the wafer.

It is another object of the present invention to replace conventional additives with an improved corrosion inhibitor for protection of copper structures on the semiconductor substrate.

It is another object of the invention to provide an improved corrosion inhibitor, which is easily rinsed off the substrate by water or other rinse medium after the completion of the residue-removal process, thereby reducing contamination of the integrated circuit.

Other objects and advantages of the invention will become fully apparent from the ensuing disclosure and appended claims.

SUMMARY OF THE INVENTION

The present invention relates generally to chemical formulations useful in semiconductor manufacturing for removing residue from wafers following a resist plasma ashing step.

In one aspect, the invention relates to a method of removing residue from a wafer following a resist plasma ashing step on such wafer, comprising contacting the wafer with a cleaning formulation, including (i) a fluoride source, (ii) at least one organic amine, (iii) a nitrogen-containing carboxylic acid or an imine, (iv) water, and optionally at least one metal chelating agent.

Another aspect of the invention relates to a wafer cleaning formulation, including (i) a fluoride source, (ii) at least one organic amine, (iii) a nitrogen-containing carboxylic acid or an imine, (iv) water, and optionally at least one metal chelating agent.

In a further aspect, the invention relates to a semiconductor wafer cleaning formulation for use in post plasma ashing semiconductor fabrication, comprising the following components in the percentage by weight (based on the total weight of the formulation) ranges shown:

| | |
|---|---|
| a fluoride source, e.g., ammonium fluoride and/or derivative(s) thereof | 1-35% |
| organic amine(s) | 20-60% |
| a nitrogenous component selected from nitrogen-containing carboxylic acids and imines | 0.1-40% |
| water | 20-50% |
| metal chelating agent(s) | 0-21% |
| TOTAL | 100% |

In a still further aspect, the invention relates to a formulation useful for post chemical mechanical polishing (CMP) cleaning, which is a dilute version of the wafer cleaning formulation outlined hereinabove, wherein the dilute formulation comprises: (i) a fluoride source, (ii) at least one organic amine, (iii) 70% to 98% water, and optionally at least one metal chelating agent and optionally a nitrogen-containing carboxylic acid or an imine.

Such formulations of the invention effectively remove inorganic residues following a plasma ashing and/or CMP step.

Such formulations also effectively remove metal halide and metal oxide residues following plasma ashing, and effectively remove slurry particles of aluminum oxides and other oxides remaining after CMP (chemical mechanical polishing).

The formulations of the present invention provide better stripping performance with less corrosivity than formulations containing either ammonium fluoride or amines. Formulations in accordance with the invention also provide better stripping performance at lower processing temperatures than conventional amine-containing formulations.

The formulations of the invention utilize a chelating agent, which may be a single-component chelating agent or a multicomponent-chelating agent, to prevent metal corrosion and increase stripping effectiveness.

Other features and advantages of the present invention will be from the ensuing disclosure and appended claims.

DETAILED DESCRIPTION OF THE PREFERRED EMBODIMENTS

Figure 1:
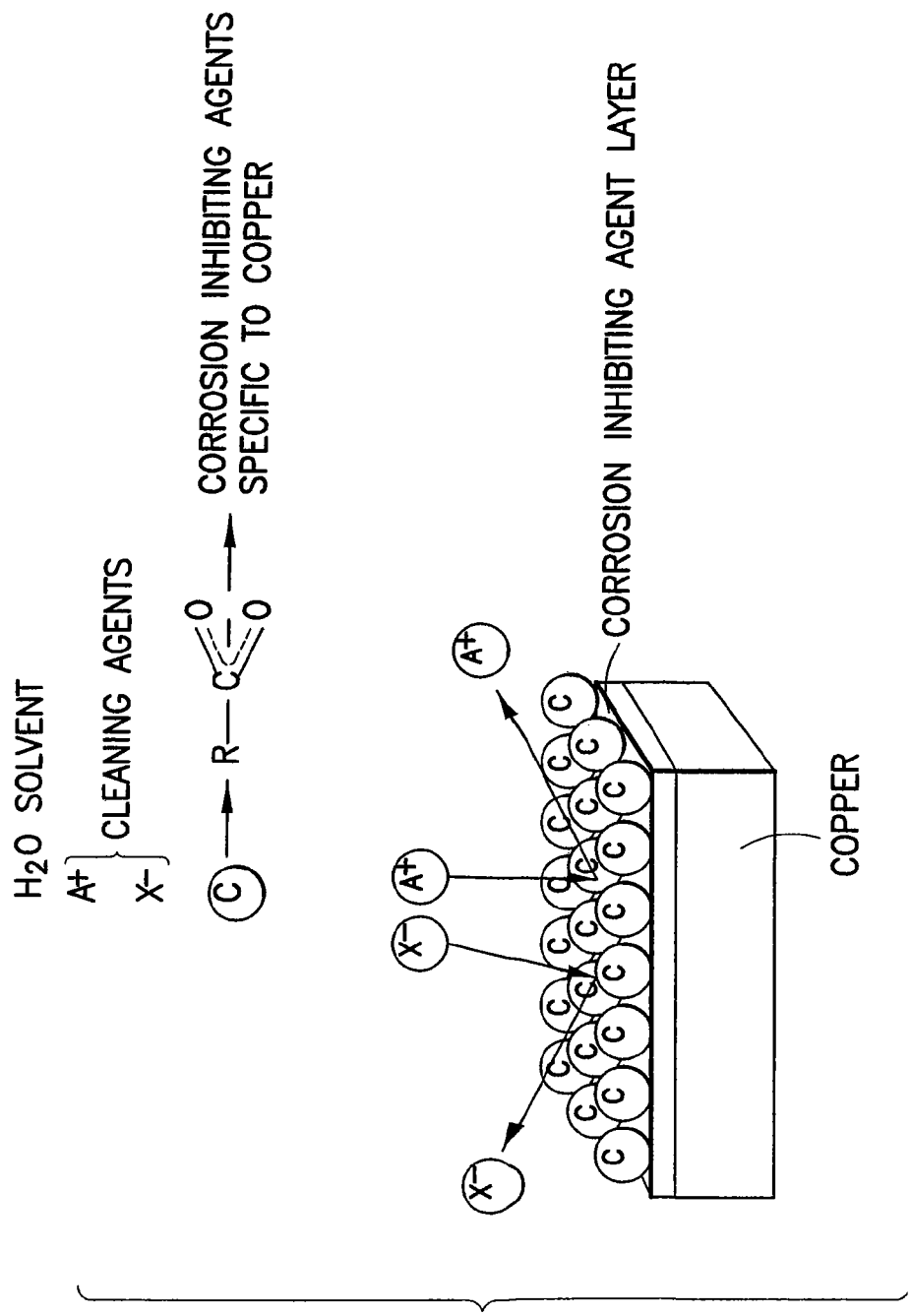
FIG. 1 is a schematic representation of a copper-specific corrosion inhibitor useful in the broad practice of the present invention, which forms a protective layer on the copper metal to prevent corrosion.

The formulations of the present invention are suitable for stripping inorganic wafer residues deriving from high-density plasma etching followed by ashing with oxygen-containing plasmas. Such formulations, in dilute form, are also suitable for removing slurry particles of aluminum oxides and other oxides remaining after CMP (chemical mechanical polishing).

The formulations advantageously contain (i) a fluoride source, such as ammonium fluoride and/or derivative(s) of ammonium fluoride, (ii) an amine or mixture of amines, (iii) a nitrogen-containing carboxylic acid or imine, (iv) water, and, optionally and preferably, (v) one or more metal chelating agents.

As used herein, a fluoride source refers to a compound or a mixture of compounds that in the aqueous cleaning formulation provides fluorine anions.

The preferred formulations for post etch removal include the following components in the percentage by weight (based on the total weight of the formulation) ranges shown:

| | |
|---|---|
| fluoride source | 1-35% |
| organic amine(s) | 20-60% |
| a nitrogenous component selected from nitrogen containing carboxylic acids and imines | 0.1-40% |
| water | 20-50% |
| metal chelating agent(s) | 0-21% |
| TOTAL | 100% |

The preferred formulations for post CMP cleaning include the following components in the percentage by weight (based on the total weight of the formulation) ranges shown:

| | |
|---|---|
| fluoride source | 0.1%-5% |
| organic amine(s) | 1%-15% |
| a nitrogenous component selected from nitrogen containing carboxylic acids and imines | 0-10% |
| water | 70%-98% |
| metal chelating agent(s) | 0-5% |
| TOTAL | 100% |

The components of the formulation as described above can be of any suitable type or species, as will be appreciated by those of ordinary skill in the art. Specific illustrative and preferred formulation components for each of the ingredients of the formulation are described below.

Particularly preferred amines include one or more of the following:
diglycolamine (DGA),
methyldiethanolamine (MDEA),
pentamethyldiethylenetriamine (PMDETA),
triethanolamine (TEA), and
triethylenediamine (TEDA).

Other amines that are highly advantageous include:
hexamethylenetetramine,
3,3-iminobis(N,N-dimethylpropylamine),
monoethanolamine
2-(methylamino)ethanol,
4-(2-hydroxyethyl)morpholine
4-(3-aminopropyl)morpholine, and
N,N-dimethyl-2-(2-aminoethoxy)ethanol.

Fluoride sources useful in the present invention include any combination of ammonia gas or ammonium hydroxide and hydrogen fluoride gas or hydrofluoric acid. Specific preferred fluoride sources include, but are not limited to one or more of the following:
ammonium fluoride, and
ammonium bifluoride Other fluoride sources that are highly advantageous include:
triethanolammonium fluoride (TEAF);
diglycolammonium fluoride (DGAF);
methyldiethanolammonium fluoride (MDEAF)
tetramethylammonium fluoride (TMAF); and
triethylamine tris(hydrogen fluoride) (TREAT-HF).

Specific preferred nitrogen-containing carboxylic acids and imines include one or more of the following:
iminodiacetic acid (IDA);
glycine;
nitrilotriacetic acid (NTA);
1,1,3,3-tetramethylguanidine (TMG); and
hydroxyethyliminodiacetic acid
ethylenediaminetetraacetic acid (EDTA).

Other nitrogen-containing carboxylic acids or imines advantageously utilizable in formulations of the invention include:
$CH_3C(=NCH_2CH_2OH)CH_2C(O)N(CH_3)_2$
$CH_3C(=NCH_2CH_2OCH_2CH_2OH)CH_2C(O)N(CH_3)_2$
$CH_3C(=NH)CH_2C(O)CH_3$
$(CH_3CH_2)_2NC(=NH)N(CH_3CH_2)_2$
$HOOCCH_2N(CH_3)_2$
$HOOCCH_2N(CH_3)CH_2COOH$ Specific preferred metal chelating agents include:
acetoacetamide;
ammonium carbamate;
ammonium pyrrolidinedithiocarbamate (APDC);
dimethyl malonate;
methyl acetoacetate;
N-methyl acetoacetamide;
2,4-pentanedione;
tetramethylammonium thiobenzoate;
1,1,1,5,5,5-hexafluoro-2,4-pentanedione H(hfac);
2,2,6,6-tetramethyl-3,5-heptanedione H(thd);
tetramethylammonium trifluoroacetate;

tetramethylthiuram disulfide (TMTDS);
trifluoracetic acid;
lactic acid;
ammonium lactate;
malonic acid
formic acid,
acetic acid,
propionic acid,
gamma-butyrolactone,
methyldiethanolammonium trifluoroacetate, and
trifluoroacetic acid.

The combination of ammonium fluoride or a substituted fluoride source, as described above, with an amine (other than an amine present as a surfactant in an amount of 1% or less) provides better stripping performance with less corrosivity than formulations containing either ammonium fluoride or amines alone. In addition, the resulting alkaline solutions are effective at lower processing temperatures (e.g., 21°-40° C.) than conventional amine-containing formulations.

The presence of nitrogen-containing carboxylic acids and/or imines enables formulations of the invention to be remarkably effective in stripping residues from semiconductor substrate surfaces containing delicate copper structures.

The nitrogen-containing carboxylic acids or imines provide functional groups that are specifically attracted to free copper atoms. As shown schematically in FIG. 1, the copper-specific corrosion inhibiting-agent C, which contacts the copper surface during the residue-removal process, will attach to the copper surface and form a protective layer to prevent the copper surface being corroded by cleaning agents $A^+$ and $X^-$.

Figure 2:
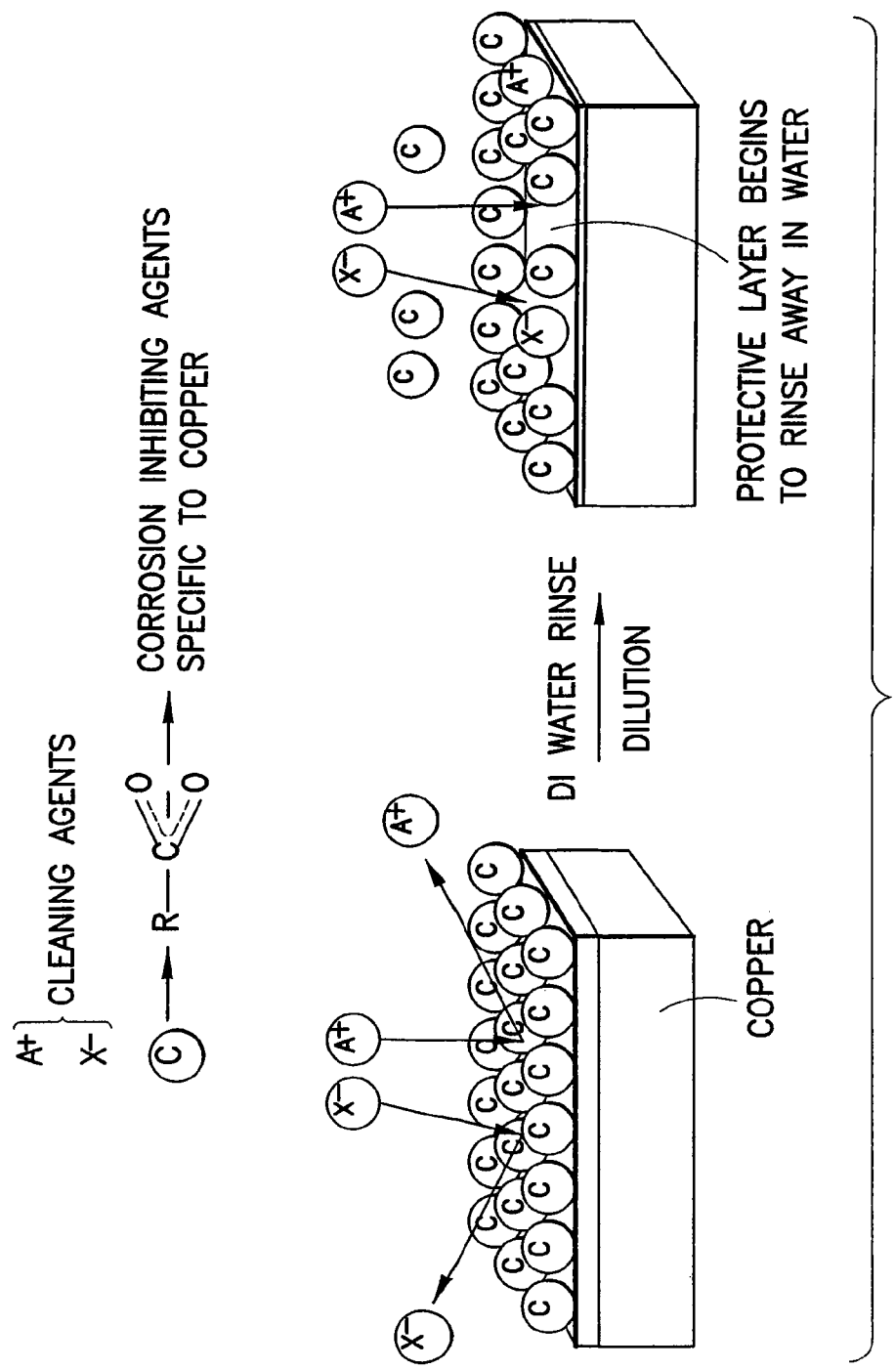
FIG. 2 is a schematic representation of the copper-specific corrosion inhibitor being rinsed away from the copper surface by deionized water.

Moreover, as shown by FIG. 2, such copper-specific corrosion-inhibiting agent C can be easily rinsed off by deionized water or other solutions and therefore leaves very little contamination on the copper surface after the cleaning operation.

The use of 1,3-dicarbonyl compounds as chelating agents and to prevent metal corrosion is a preferred feature of the inventive formulations, to increase their effectiveness.

In various prior art formulations, amines are present in amounts of 1% or less of the formulation as surfactants, or otherwise are not utilized as formulation ingredients at all. Additionally, the prior art formulations are acidic (pH<7) in character. In preferred formulations of the present invention, the amines are present as major components of the formulation, are highly effective in stripping action, and yield formulations of a basic pH character (pH>7).

The formulations of the invention may include a wide variety of organic amines, substituted ammonium fluorides, and nitrogen-containing carboxylic acids, other than those specifically exemplified. Particular substituted ammonium fluorides of suitable character include those of the general formula, $R_1R_2R_3R_4NF$ in which each of the respective R species is independently selected from hydrogen and aliphatic groups. Suitable nitrogen-containing carboxylic acids include those of the general structure COOH—CH$_2$—NRR', wherein R and R' are each independently selected from the group consisting of hydrogen, alkyl, aryl, and carboxylic acid moieties. Suitable metal chelating agents include 1,3-dicarbonyl compounds of the general structure X—CHR—Y. In compounds of such formula, R is either a hydrogen atom or an aliphatic group, e.g., $C_1$-$C_8$ alkyl, aryl, alkenyl, etc. X and Y may be the same as or different from one another, and are functional groups containing multiply-bonded moieties with electron-withdrawing properties, as for example CONH$_2$, CONHR', CN, NO$_2$, SOR', or SO$_2$Z, in which R' represents a $C_1$-$C_8$ alkyl group and Z represents another atom or group, e.g., hydrogen, halo or $C_1$-$C_8$ alkyl.

Other chelating agent species useful in the compositions of the invention include amine trifluoroacetates of the general formula, $R_1R_2R_3R_4N^+$ $^-O_2CCF_3$ in which each of the R groups is independently selected from hydrogen and aliphatic groups, e.g., $C_1$-$C_8$ alkyl, aryl, alkenyl, etc.

The formulations of the invention optionally may also include such components as surfactants, stabilizers, corrosion inhibitors, buffering agents, and co-solvents, as useful or desired in a given end use application of formulations of the invention.

Formulations in accordance with the present invention are particularly useful on wafers that have been etched with chlorine- or fluorine-containing plasmas, followed by oxygen plasma ashing. The residues generated by this type of processing typically contain metal oxides. Such residues are often difficult to dissolve completely without causing corrosion of metal and titanium nitride features required for effective device performance. Also, metal oxide and silicon oxide slurry particles remaining after CMP will also be effectively removed by formulations in accordance with the present invention.

The features and advantages of the invention are more fully shown by the following non-limiting examples.

Example 1

Copper-specific corrosion inhibitors including either hydrogen-containing carboxylic acids or imines were tested in two different types of alkaline cleaning formulations, with the following components and characteristics.

TABLE 1

| | Components | Temp., ° C. | pH | Copper Etch Rate (Å/min) |
|---|---|---|---|---|
| Formulation 1 | dimethylacetoacetamide, amine, and water | 70 | 6.2 | 17.4 |
| Formulation 2 | ammonium fluoride, triethanolamine, pentamethdiethylenetriamine, and water | 40 | 8.6 | 7.5 |

The copper etch rate was determined by a standard four-point probe technique. Addition of corrosion inhibitors in accordance with the present invention significantly slowed down the copper etch rate, as shown by the following table, and effectively prevented undesirable corrosion during the cleaning process:

TABLE 2

| Corrosion Inhibitor | Temp. (° C.) | Formulation Used | Concentration (%) | pH of solution | Copper Etch Rate (Å/min) | Reduction of Etch Rate (%) |
|---|---|---|---|---|---|---|
| Iminodiacetic Acid | 40 | 2 | 1.5 | 8.0 | 1-2 | −73.3~86.7 |
| Glycine | 40 | 2 | 1.5 | 9.2 | 3.6 | −52.0 |

TABLE 2-continued

| Corrosion Inhibitor | Temp. (° C.) | Formulation Used | Concentration (%) | pH of solution | Copper Etch Rate (Å/min) | Reduction of Etch Rate (%) |
|---|---|---|---|---|---|---|
| Nitrilotriacetic Acid | 40 | 2 | 1.5 | 8.2 | 3.6 | −52.0 |
| 1,1,3,3-tetramethylguanidine | 40 | 2 | 1.5 | 8.7 | 3.4 | −54.7 |
| $CH_3C(=NCH_2CH_2OH)CH_2C(O)N(CH_3)_2$ | 70 | 1 | 24 | 10.9 | 6.2 | −64.4 |
| $CH_3C(=NCH_2CH_2OCH_2CH_2OH)CH_2C(O)N(CH_3)_2$ | 70 | 1 | 36 | 10.7 | 0.32 | −98.2 |
| $CH_3C(=NH)CH_2C(O)CH_3$ | 40 | 2 | 13.68 | 7.9 | 4.4 | −41.3 |

Example 2

A contamination test was carried out on Formulation 2 containing iminodiacetic acid inhibitor. The semiconductor wafer to be cleaned contained copper and silicon films. After the completion of the cleaning operation, the wafer was rinsed by deionized water at 25° C. for about 15 minutes. The Secondary Ion Mass Spectrometry data (SIMS) obtained are as follows:

| | Cu (atoms/cm$^2$) | F (atoms/cm$^2$) | C (atoms/cm$^2$) | $Cu_xO$ (Å) |
|---|---|---|---|---|
| Uncleaned Wafer | $1.6 \times 10^{10}$ | $3.3 \times 10^{13}$ | $7.5 \times 10^{13}$ | 42 |
| Cleaned Wafer | $8.5 \times 10^{9}$ | $5.1 \times 10^{13}$ | $1.5 \times 10^{13}$ | 15 |

The foregoing results show that the copper oxide $Cu_xO$ has been effectively removed by the cleaning process, while carbon contamination, which is mainly caused by the organic corrosion inhibitors in the cleaning formulation, has been greatly reduced.

Figure 3:
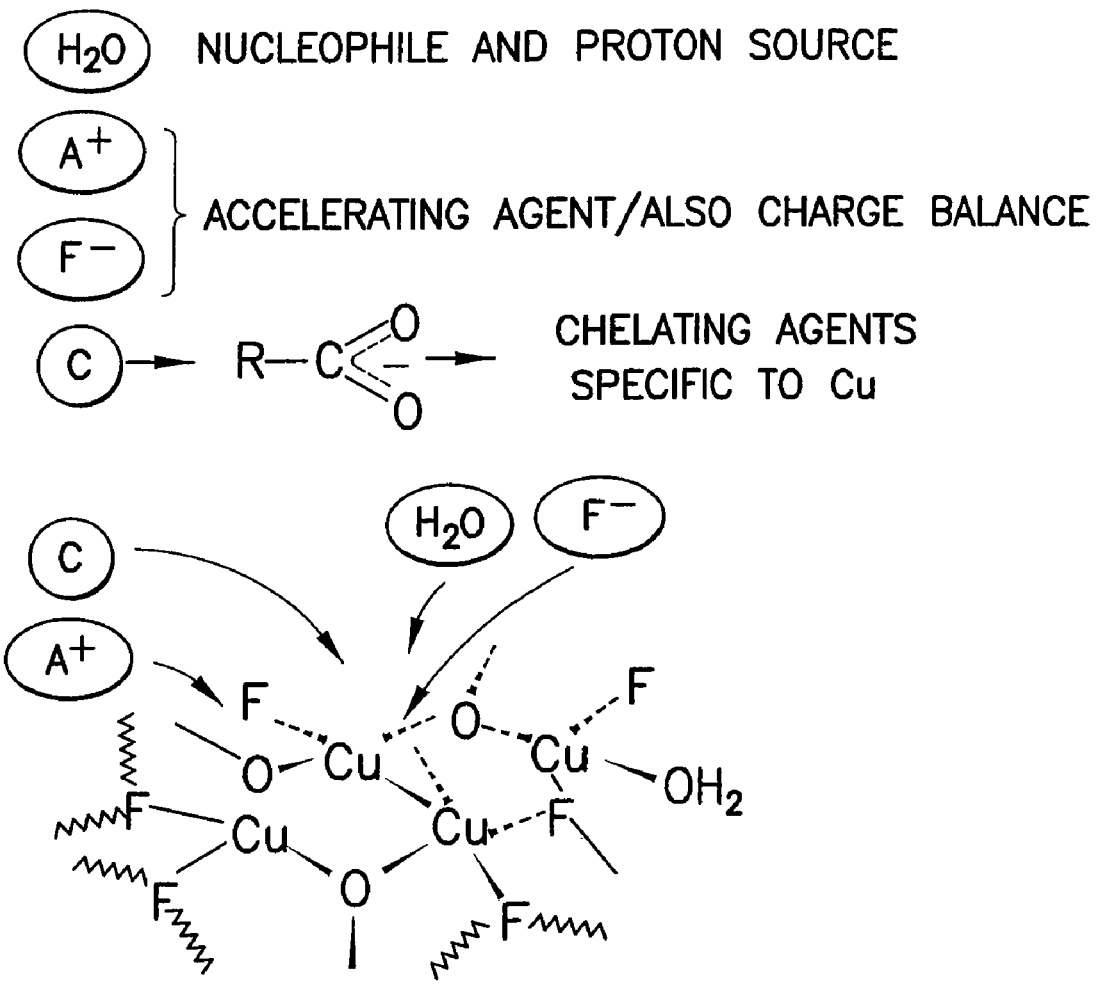
FIG. 3 depicts cleaning components of the present invention interacting with a surface.

The present invention employs dilute alkaline fluoride in compositions for post CMP cleaning of silicon oxide or aluminum oxide particles from metallic surfaces such as copper or tungsten. FIG. 3 depicts how the cleaning components of the present invention interact with the surface. Specially, FIG. 3 depicts that Alkaline Fluoride 30 and chelating agents 32 dissolving inorganic oxide residues 34 after a CMP process.

Figure 4:
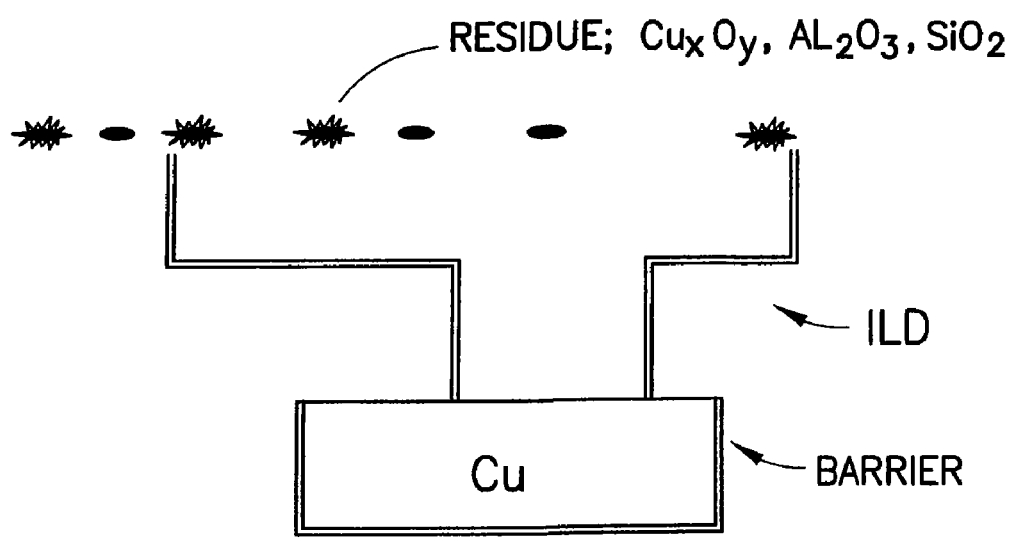
FIG. 4 illustrates that formulations of the present invention may be used to remove residues and particles.

FIG. 4 illustrates that the formulations taught by the present invention may be used to remove residues 40 and particles 42 for a copper surface 44. In FIG. 4 particles 42 and residues 40 adhere to metal surface 44 as well as dielectric surface 46. Particles 42 and residues 40 may remain following a CMP process. The chemical solutions of the present invention degrade the attractive forces between the residue and the surface as well as dissolve copper and tungsten oxides and oxy-halides.

Formulations that have been found to be effective in cleaning residue and slurry particles from metal Surfaces may have a pH value in a range for from about 3 to 11, but typically have pH values between about 7 and about 9. These formulations generally are aqueous solutions that comprise a fluoride source, an organic amine, and metal chelating agent. The individual constituents typically constitute a fluoride source and/or a derivative thereof as about 0.1 to about 5.0% of the formulation, wherein the fluoride may be one of many such fluoride sources known to those skilled in the art including one or more of:
any combination of ammonia gas or ammonium hydroxide and hydrogen fluoride gas or hydrofluoric acid;
ammonium fluoride,
ammonium bifluoride;
triethanolammonium fluoride (TEAF);
diglycolammonium fluoride (DGAF);
methyldiethanolammonium fluoride (MDEAF)
tetramethylammonium fluoride (TMAF);
triethylamine tris(hydrogen fluoride) (TREAT-HF).

The organic amine or mixture of two amines typically comprises between about 1% and about 15% of the formulation of the present invention, wherein the organic amine can be one of many such organic amines known to those skilled in the art including:
diglycolamine (DGA),
methyldiethanolamine (MDEA),
pentamethyldiethylenetriamine (PMDETA),
triethanolamine (TEA),
triethylenediamine (TEDA),
hexamethylenetetramine,
3,3-iminobis(N,N-dimethylpropylamine),
monoethanolamine.
2-(methylamino)ethanol,
4-(2-hydroxyethyl)morpholine
4-(3-aminopropyl)morpholine, and
N,N-dimethyl-2-(2-aminoethoxy)ethanol.

The nitrogenous component of the mixture typically comprises 0 to about 10% of the mixture. wherein the nitrogenous component may be one of many such nitrogenous component sources known to those skilled in the art including one or more of:
iminodiacetic acid (IDA),
glycine,
nitrilotriacetic acid (NTA),
hydroxyethyliminodiacetic acid,
1,1,3,-tetramethylguanidine (TMG),
ethylenediaminetetraacetic acid (EDTA),
$CH_3C(=NCH_2CH_2OH)CH_2C(O)N(CH_3)_2$,
$CH_3C(=NCH_2CH_2OCH_2CH_2OH)CH_2C(O)N(CH_3)_2$,
$CH_3C(=NH)CH_2C(O)CH_3$,
$(CH_3CH_2)_2NC(=NH)N(CH_3CH_2)_2$,
$HOOCCH_2N(CH_3)_2$, and
$HOOCCH_2N(CH_3)CH_2COOH$.

The metal chelating agent or mixture of chelating agents typically comprises about 0 to about 5.0% of the formulation. Typical metal chelating agent may be one of many such metal chelating agents known to those skilled in the art including:
acetoacetamide;
ammonium carbamate;
ammonium pyrrolidinedithiocarbamate (APDC);
dimethyl malonate;
methyl acetoacetate;
N-methyl acetoacetamide;
2,4-pentanedione;
1,1,1,5,5,5-hexafluoro-2,4-pentanedione H(hfac);
2,2,6,6-tetramethyl-3,5-heptanedione H(thd);
tetramethylammonium thiobenzoate;
tetramethylammonium trifluoroacetate;
tetramethylthiuram disulfide (TMTDS);

trifluoracetic acid;
lactic acid;
ammonium lactate;
malonic acid
formic acid,
acetic acid,
propionic acid,
gamma-butyrolactone,
methyldiethanolammonium trifluoroacetate, and
trifluoroacetic acid.

Several representative examples of formulations are:

| | |
|---|---|
| Triethanolamine | 4.5% |
| Ammonium Fluoride | 0.5% |
| Water | 95% |
| PMDETA | 3.8-4.5% |
| Ammonium Fluoride | 0.5% |
| 2,4-Pentanedione | 1% |
| Water | 94-94.7% |
| TEA | 1.7% |
| PMDETA | 1.5% |
| TEAHF | 2% |
| Iminodiacetic Acid | 0.4% |
| Ammonium Bifluoride | 0.5% |
| Water | 93.9% |
| TEA | 3.5% |
| PMDETA | 1.5% |
| 2,4-Pentanedione | 1.35% |
| Ammonium Fluoride | 1.2% |
| Water | 92.45% |
| TEA | 7% |
| PMDETA | 3% |
| 2,4-Pentanedione | 2.7% |
| Ammonium Fluoride | 2.4% |
| Water | 84.9% |

Figure 5:
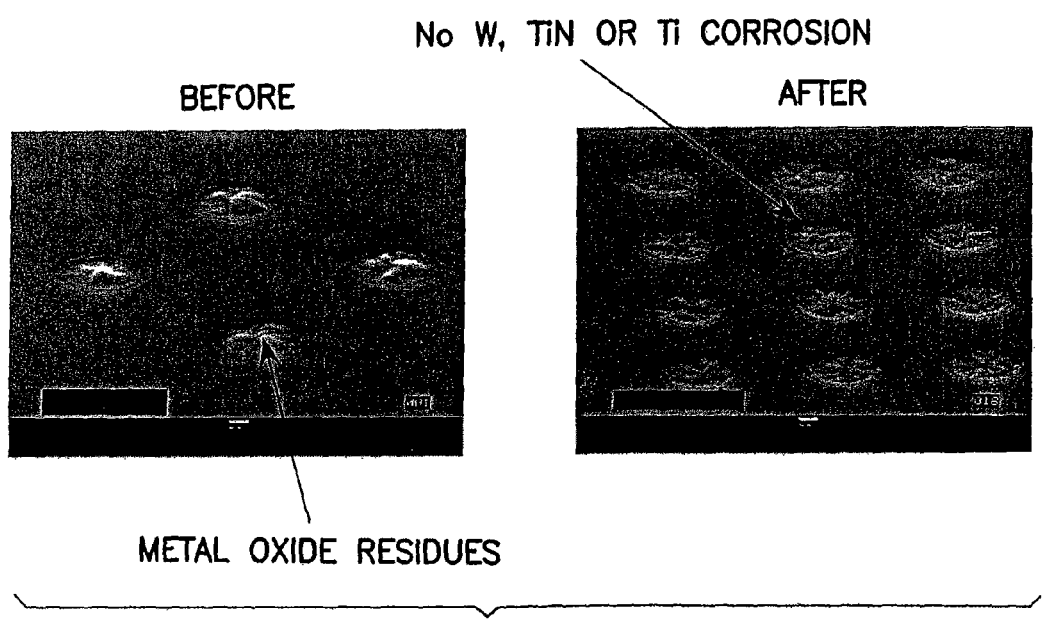
FIG. 5 provides a SEM representing results obtained from an immersion process.
Figure 6:
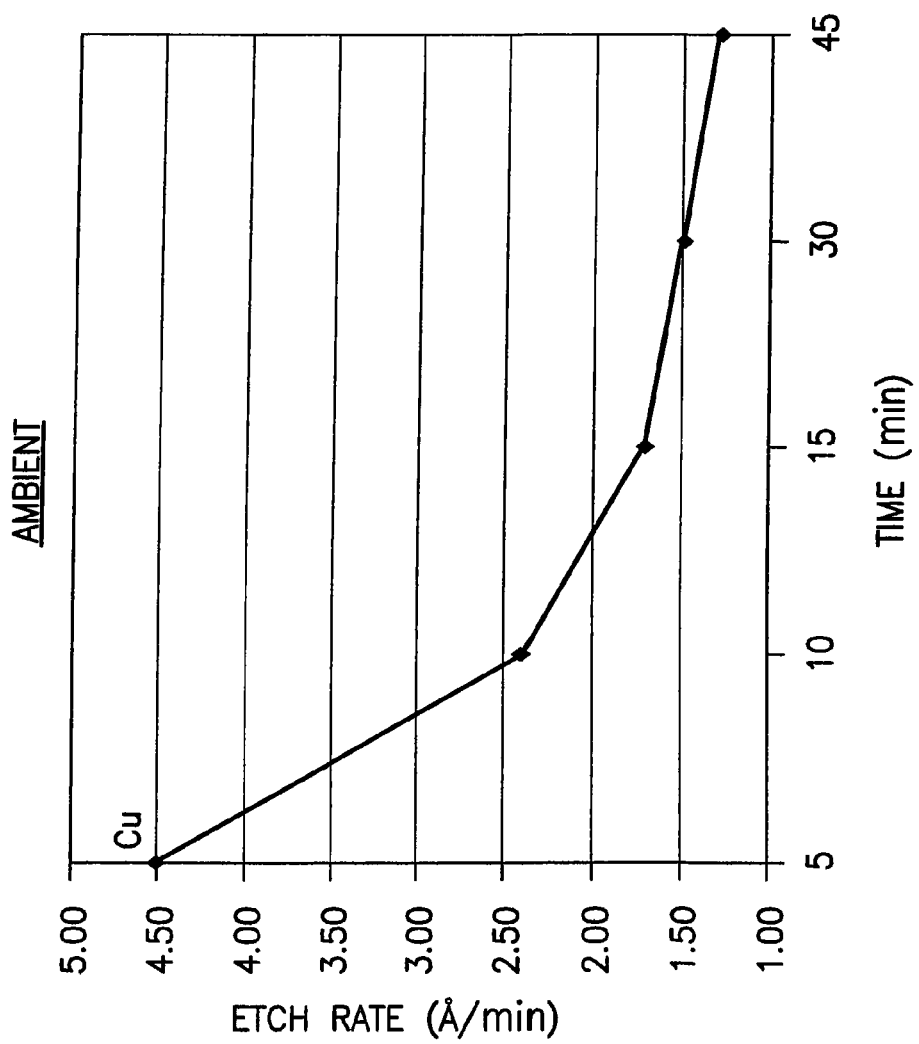
FIG. 6 illustrates the material etch rate on interconnect materials.

Wafers can be immersed in chemical solutions or chemicals can be applied to the wafer surface by spray or through a brush scrubbing system. FIG. 5 depicts a SEM representing the results obtained with a standard immersion process. Specifically FIG. 5 depicts Tungsten plugs after alumina slurry CMP and immersion in formula c for 10 min at 30° C. Furthermore, selectivity to exposed materials may be illustrated by etch rate data. FIG. 6 and table 3 illustrate the material etch rate on interconnect materials including an electroplated copper film.

TABLE 3

| Material | Etch Rate, Å/min for 21° C. @ 30 min |
|---|---|
| Copper | ~1 |
| Tantalum Nitride | <0.1 |
| Titanium | <0.1 |
| Titanium Nitride | 1.0 |
| Tungsten | 0.2 |
| TEOS | 1.5 |
| BPSG | 4.5 |

While the invention has been described herein with reference to specific features, aspects, and embodiments, it will be appreciated that the invention is not thus limited. The invention therefore may correspondingly embodied in a wide variety of compositions, with corresponding variations of ingredients, and end-use applications. The invention therefore is to be understood as encompassing all such variations, modifications and alternative embodiments, within the spirit and scope of the invention as hereafter claimed.

What is claimed is:

1. A method of making an integrated circuit containing a copper containing substrate, comprising contacting said substrate with a wafer cleaning formulation, wherein said wafer cleaning formulation comprises at least one amine and a nitrogen-containing carboxylic acid or an imine selected from the group consisting of:
   iminodiacetic acid (IDA),
   glycine,
   1,1,3,3-tetramethylguanidine (TMG),
   $CH_3C(=NCH_2CH_2OH)CH_2C(O)N(CH_3)_2$,
   $CH_3C(=NCH_2CH_2OCH_2CH_2OH)CH_2C(O)N(CH_3)_2$,
   $CH_3C(=NH)CH_2C(O)CH_3$,
   $(CH_3CH_2)_2NC(=NH)N(CH_3CH_2)_2$,
   $HOOCCH_2N(CH_3)_2$, and
   $HOOCCH_2N(CH_3)CH_2COOH$.

2. The method of claim 1, wherein the wafer cleaning composition has a pH greater than 7.

3. The method of claim 1, wherein the amount of nitrogen-containing carboxylic acid or imine is 0.1-40 weight percent, based on the total weight of the composition.

4. The method of claim 1, wherein the wafer cleaning composition further comprises a fluoride source.

5. The method of claim 4, wherein the fluoride source comprises a fluoride species selected from the group consisting of:
   ammonium bifluoride,
   ammonium fluoride,
   triethanolammonium fluoride (TEAF),
   diglycolammonium fluoride (DGAF),
   tetramethylammonium fluoride (TMAF),
   methyldiethanolammonium fluoride (MDEAF), and
   triethylamine tris(hydrogen fluoride) (TREAT-HF).

6. The method of claim 4, wherein the amount of fluoride source is 1-35% weight percent, based on the total weight of the composition.

7. The method of claim 1, wherein the organic amine(s) comprise an amine(s) selected from the group consisting of:
   diglycolamine (DGA),
   methyldiethanolamine (MDEA),
   pentamethyldiethylenetriamine (PMDETA),
   triethanolamine (TEA),
   triethylenediamine (TEDA),
   hexamethylenetetramine,
   3,3-iminobis(N,N-dimethylpropylamine),
   monoethanolamine,
   2-(methylamino)ethanol,
   4-(2-hydroxyethyl)morpholine,
   4-(3-aminopropyl)morpholine, and
   N,N-dimethyl-2-(2-aminoethoxy)ethanol.

8. The method of claim 1, wherein the amount of organic amine(s) is 20-60% weight percent, based on the total weight of the composition.

9. The method of claim 1, wherein the wafer cleaning formulation further comprises water.

10. The method of claim 9, wherein the amount of water is 20-50% weight percent, based on the total weight of the composition.

11. The method of claim 1, wherein the wafer cleaning formulation further comprises at least one metal chelating agent selected from the group consisting of:
   acetoacetamide,
   ammonium carbamate,
   ammonium pyrrolidinedithiocarbamate (APDC),
   dimethyl malonate,
   methyl acetoacetate,
   N-methyl acetoacetamide,
   2,4-pentanedione,
   1,1,1,5,5,5-hexafluoro-2,4-pentanedione H(hfac),
   2,2,6,6-tetramethyl-3,5-heptanedione H(thd), tetramethylammonium thiobenzoate,
tetramethylammonium trifluoroacetate,
tetramethylthiuram disulfide (TMTDS),
trifluoracetic acid,
lactic acid,
ammonium lactate,
malonic acid,
formic acid,
acetic acid,
propionic acid,
gamma-butyrolactone,
iminodiacetic acid,
methyldiethanolammonium trifluoroacetate, and
trifluoroacetic acid.

12. The method of claim 11, wherein the amount of at least one metal chelating agent is 0-21% weight percent, based on the total weight of the composition.

13. The method of claim 4, wherein said fluoride source comprises a compound having the general formula $R_1R_2R_3R_4NF$ in which each of the R groups is independently selected from hydrogen atoms, $C_1$-$C_8$ alkyl, aryl and alkenyl groups, and wherein said formulation includes a metal chelating agent of the formula:

X—CHR—Y in which R is either hydrogen, $C_1$-$C_8$ alkyl, aryl or alkenyl group and X and Y are functional groups containing multiply bonded moieties having electron-withdrawing properties.

14. The method of claim 13, wherein each of X and Y is independently selected from $CONH_2$, CONHR', CN, $NO_2$, SOR', and $SO_2Z$ in which R' is $C_1$-$C_8$ alkyl and Z is hydrogen, halo, or $C_1$-$C_8$ alkyl.

15. The method of claim 4, wherein said fluoride source comprises a compound having the formula $R_1R_2R_3R_4NF$ in which each of the R groups is hydrogen, $C_1$-$C_8$ alkyl, aryl or alkenyl groups, and wherein said formulation includes a metal chelating agent of the formula, $R_1R_2R_3R_4N^{+-}O_2CCF_3$ in which each of the R groups is independently hydrogen, $C_1$-$C_8$ alkyl, aryl or alkenyl groups.

16. The method of claim 1, wherein the substrate comprises copper.

17. The method of claim 1, further comprising a fluoride source, water, and optionally metal chelating agent(s).

18. The method of claim 17, comprising triethanolamine, triethanolammonium fluoride, pentamethyldiethylenetriamine, iminodiacetic acid, ammonium bifluoride and water.

19. The method of claim 1, wherein the substrate contacted with the wafer cleaning formulation comprises slurry particles remaining after chemical mechanical polishing.

* * * * *

UNITED STATES PATENT AND TRADEMARK OFFICE
CERTIFICATE OF CORRECTION

| | | |
|---|---|---|
| PATENT NO. | : 8,293,694 B2 | Page 1 of 1 |
| APPLICATION NO. | : 12/581843 | |
| DATED | : October 23, 2012 | |
| INVENTOR(S) | : William A. Wojtczak et al. | |

It is certified that error appears in the above-identified patent and that said Letters Patent is hereby corrected as shown below:

Title Page, Item [75] Inventor: change "Ma. Fatimo Seijo" to --Ma. Fatima Seijo--

Signed and Sealed this
Eleventh Day of December, 2012

David J. Kappos
*Director of the United States Patent and Trademark Office*